United States Patent
Liu et al.

(10) Patent No.: US 11,619,696 B2
(45) Date of Patent: Apr. 4, 2023

(54) 3D FLOW COMPENSATED INTERLEAVED EPI IN COMBINATION WITH SWAPPED READOUT

(71) Applicant: Siemens Healthcare GmbH, Erlangen (DE)

(72) Inventors: Wei Liu, Shenzhen (CN); Kun Zhou, Shenzhen (CN)

(73) Assignee: Siemens Healthcare GmbH, Erlangen (DE)

( * ) Notice: Subject to any disclaimer, the term of this patent is extended or adjusted under 35 U.S.C. 154(b) by 0 days.

(21) Appl. No.: 17/348,927

(22) Filed: Jun. 16, 2021

(65) Prior Publication Data

US 2021/0396827 A1 Dec. 23, 2021

(30) Foreign Application Priority Data

Jun. 17, 2020 (CN) .......................... 202010552018.8

(51) Int. Cl.
*G01R 33/561* (2006.01)
*G01R 33/56* (2006.01)
*G01R 33/565* (2006.01)

(52) U.S. Cl.
CPC ..... *G01R 33/5616* (2013.01); *G01R 33/5602* (2013.01); *G01R 33/5608* (2013.01); *G01R 33/56509* (2013.01)

(58) Field of Classification Search
CPC ............ G01R 33/5602; G01R 33/5608; G01R 33/5616; G01R 33/56509
See application file for complete search history.

(56) References Cited

U.S. PATENT DOCUMENTS

| 5,926,022 A | 7/1999 | Slavin et al. |
| 9,746,539 B2 * | 8/2017 | Eggers ............. G01R 33/56527 |
| 2019/0128991 A1 * | 5/2019 | Shirai ............. G01R 33/56536 |
| 2020/0072928 A1 * | 3/2020 | Patil .................. G01R 33/5616 |

OTHER PUBLICATIONS

Jaco J.M.Zwanenburg et al. "Fast high resolution whole brain T2* weighted imaging using echo planar imaging at 7T" Neuroimage. 2011;56:1902-1907; 2011.
B.A. Poser et al. "Three dimensional echo-plannar imaging at 7 Tesla" Neuroimage, 2010; 51:261-266; 2010.
Gabriele Beck et al. "Reducing Oblique Flow Effects in Interleaved EPI With a Centric Reordering Technique" Magnetic Resonance in Medicine, 2001;45:623-629; 2001.
Haacke EM, Xu Y, Cheng YC, Reichenbach JR. Susceptibility Weighted Imaging (SWI). Magnetic Resonance in Medicine 2004; 52 (3): 612-18.; 2004.

(Continued)

*Primary Examiner* — Gregory H Curran
(74) *Attorney, Agent, or Firm* — Banner & Witcoff Ltd.

(57) ABSTRACT

The disclosure relates to a fast susceptibility imaging techniques for performing flow compensations in the slice, phase, and frequency encoding directions for the central echo of a plurality of echoes excited each time in interleaved echo planar imaging (iEPI). The echo data for which flow compensations have been performed may be collected, and susceptibility-weighted imaging (SWI) performed for collected echo data. The fast susceptibility imaging techniques may reduce scan time.

10 Claims, 7 Drawing Sheets

(56) References Cited

OTHER PUBLICATIONS

Kim Butts et al. "Analysis of flow effects in echo-planar imaging" J. Magn. Reson. Imaging 1992; 2:285-293; 1992.
Mahesh R. Patel et al. "Detection of hyperacute primary intraparenchymal hemorrhage by magnetic resonance imaging" Stroke, vol. 27, pp. 2321-2324, 1996; 1996.
Dongmei Wu et al. "A Fully Flow-Compensated Multiecho Susceptibility-Weighted Imaging Sequence: The Effects of Acceleration and Background Field on Flow Compensation" Magnetic Resonance in Medicine, 2016; 76:479-486; 2016.
Jeffrey L. Duerk et al. "Theoretical aspects of motion sensitivity and compensation in echo planar imaging" J. Magn. Reson. Imaging, 1991; 1:643-650; 1991.
Glenn S. Slavin et al. "Gradient Moment Smoothing: A New Flow Compensation Technique for Multi-Shot Echo-Planar Imaging" Magn Reson Med. 1997;38:368-377; 1997.
P. Sati. et al. "Ultra-Fast Acquisition of High-Resolution Susceptibility-Weighted-Imaging at 3T" Proc Intl Soc Mag Reson Med. 19, 2011; 2011.

* cited by examiner

3D FLOW COMPENSATED INTERLEAVED EPI IN COMBINATION WITH SWAPPED READOUT

CROSS-REFERENCE TO RELATED APPLICATIONS

The present application claims the benefit of the filing date of China patent application no. CN 202010552018.8, filed on Jun. 17, 2020, the contents of which are incorporated herein by reference in their entirety.

TECHNICAL FIELD

The disclosure relates to the technical field of magnetic resonance imaging, in particular to a fast susceptibility imaging method and device and a magnetic resonance imaging system.

BACKGROUND

In magnetic resonance imaging (MRI), the phase accumulation obtained is zero after a static tissue goes through slice select gradients whose sizes are the same but directions are opposite. However, for a moving tissue, for example, flowing blood or cerebrospinal fluid, the phase accumulation is not zero. Thus, when a phase encoding gradient is exerted, a moving tissue having a phase will be encoded incorrectly to appear in other positions and form a flow artifact.

Flow compensation (FC), also known as gradient moment nulling (GMN), is a technique which uses a specially-designed gradient field to reduce or eliminate flow artifacts. A plurality of gradient combination modes are available for use with the FC technique. After a plurality of transformations of positive and negative gradient fields with different areas, the phase deviations of fluids at different flow rates will eventually be close to zero, and thus motion artifacts are eliminated. FC usually compensates the influence caused by fluids at an even flowing rate by eliminating the first-order moment, and GMN as used herein also refers to the first-order moment compensation.

Susceptibility-weighted imaging (SWI) is a magnetic resonance contrast enhanced imaging technique, which uses a T2* weighted gradient echo sequence as a sequence basis and provides an image contrast enhancement according to the susceptibility differences between different tissues. Both magnitude images and phase images can be obtained simultaneously. SWI is widely applied in various clinical environments to evaluate iron-containing tissues, vein vessels, and other susceptible substances. The traditional SWI is obtained by using 3D fully flow-compensated T2* weighted gradient recalled echoes (GREs). Since full flow compensations are performed, namely flow compensations performed in the slice direction, phase encoding direction, and frequency encoding direction (also known as readout gradient direction) for each echo, a long scan time is required for the SWI method.

SUMMARY

In view of this, the embodiments of the present disclosure provide a fast susceptibility imaging method in one aspect, and provide a fast susceptibility imaging device and a magnetic resonance imaging system in another aspect so as to improve the scan efficiency.

A fast susceptibility imaging method provided by the embodiments of the present disclosure comprises:

performing flow compensations in the slice, phase, and frequency encoding directions for the central echo of a plurality of echoes excited each time in interleaved Echo Planar Imaging, collecting echo data for which flow compensations have been performed, and performing susceptibility-weighted imaging for collected echo data.

In one implementation mode, performing flow compensations in the slice, phase, and frequency encoding directions for the central echo of a plurality of echoes excited each time comprises: performing flow compensations in the slice, phase, and frequency encoding directions according to the following formulas:

$$M_{1,par} = M_{0,par}\Delta t_{par};$$

$$M_{1,phase} = M_{0,phaseprephase}\Delta t_p + \sum_{k=1}^{k_{center}} M_{0,pk}\Delta t_{pk}; \text{ and}$$

$$M_{1,freq} = M_{0,freqprephase}\Delta t_f + M_{1,k_{center}} + \sum_{k=0}^{k_{center}} M_{0,fk}\Delta t_{fk},$$

wherein $M_{1,par}$, $M_{1,phase}$, and $M_{1,freq}$ are first-order moments at the central echo in the slice encoding direction, phase encoding direction, and frequency encoding direction, respectively, $M_{0,phaseprephase}$, $M_{0,freqprephase}$, and $M_{0,par}$ are the zero-order moments of the prephase gradients in the phase and frequency encoding directions and the slice encoding gradient, respectively, and are different in different excitations, $\Delta t_p$, $\Delta t_f$, and $\Delta t_{par}$ are the times from the prephase gradient centers in the phase and frequency encoding directions and the slice encoding gradient center to the echo center, respectively, $M_{0,pk}$ and $M_{0,fk}$ are zero-order moments of the phase and frequency encoding gradients of the $k^{th}$ echo in one excitation, respectively, $\Delta t_{pk}$ and $\Delta t_{fk}$ are the times from the encoding gradient of the $k^{th}$ echo in the phase and frequency encoding directions to the central echo, respectively, $\Delta t_p$, $\Delta t_{pk}$, $\Delta t_f$ and $\Delta t_{fk}$ are different in different excitations, and $M_{1,k_{center}}$ is the first-order moment of the frequency encoding gradient of the central echo in one excitation.

In one implementation mode, collecting echo data for which flow compensations have been performed comprises:

performing two scans for each excitation, wherein readout gradients with opposite polarities are used for data collections during the two scans, and adding the data collected during the two scans to obtain corresponding echo data of the excitation.

A fast susceptibility imaging device provided by the embodiments of the present disclosure comprises:

a flow compensation module configured to perform flow compensations in the slice, phase, and frequency encoding directions for the central echo of a plurality of echoes excited each time in interleaved Echo Planar Imaging, a data acquisition module configured to collect echo data for which flow compensations have been performed, and a weighted imaging module configured to perform susceptibility-weighted imaging for collected echo data.

In one implementation mode, the flow compensation module performs flow compensations in the slice, phase, and frequency encoding directions according to the following formulas:

$$M_{1,par} = M_{0,par}\Delta t_{par};$$

$$M_{1,phase} = M_{0,phaseprephase}\Delta t_p + \sum_{k=1}^{k_{center}} M_{0,pk}\Delta t_{pk}; \text{ and}$$

$$M_{1,freq} = M_{0,freqprephase}\Delta t_f + M_{1,k_{center}} + \sum_{k=0}^{k_{center}} M_{0,fk}\Delta t_{fk},$$

wherein $M_{1,par}$, $M_{1,phase}$, and $M_{1,freq}$ are first-order moments at the central echo in the slice encoding direction, phase encoding direction, and frequency encoding direction, respectively, $M_{0,phaseprephase}$, $M_{0,freqprephase}$, and $M_{0,par}$ are the zero-order moments of the prephase gradients in the phase and frequency encoding directions and the slice encoding gradient, respectively, and are different in different excitations, $\Delta t_p$, $\Delta t_f$, and $\Delta t_{par}$ are the times from the prephase gradient centers in the phase and frequency encoding directions and the slice encoding gradient center to the echo center, respectively, $M_{0,pk}$ and $M_{0,fk}$ are zero-order moments of the phase and frequency encoding gradients of the $k^{th}$ echo in one excitation, respectively, $\Delta t_{pk}$ and $\Delta t_{fk}$ are the times from the encoding gradient of the $k^{th}$ echo in the phase and frequency encoding directions to the central echo, respectively, $\Delta t_p$, $\Delta t_{pk}$, $\Delta t_f$, and $\Delta t_{fk}$, are different in different excitations, and $M_{1,k_{center}}$ is the first-order moment of the frequency encoding gradient of the central echo in one excitation.

In one implementation mode, the data acquisition module performs two scans for each excitation, wherein readout gradients with opposite polarities are used for data collections during the two scans, and adds the data collected during the two scans to obtain corresponding echo data of the excitation.

A magnetic resonance imaging system provided by the embodiments of the present disclosure comprises the fast susceptibility imaging device as described throughout the specification and claims.

From the above-mentioned technical solution, it can be seen that since flow compensations are performed in the slice, phase, and frequency encoding directions for the central echo of a plurality of echoes excited each time and a high-efficiency acquisition solution, compared with the prior SWI sequence, is adopted in the embodiments of the present disclosure, the scan efficiency can be improved on the basis that the flow compensations are basically guaranteed. In addition, a high scan efficiency and a small distortion can be maintained in 3D iEPI since the echo interval is short, compared with the 3D fully flow compensated iEPI sequence in the flyback method.

In addition, for each excitation, readout gradients with opposite polarities are used to perform two scans, and the phase oscillation between odd and even echoes after each excitation can be further reduced

BRIEF DESCRIPTION OF THE DRAWINGS/FIGURES

The following will describe in detail the preferred embodiments of the present disclosure by reference to the drawings so that those skilled in the art can have a clearer idea of the above-mentioned and other characteristics and advantages of the present disclosure.

DESCRIPTION OF REFERENCE NUMERALS IN THE DRAWINGS

Figure 1:
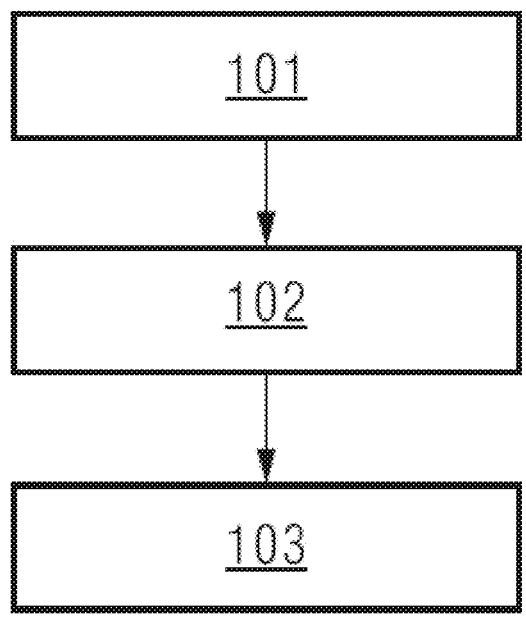
FIG. 1 shows an example fast susceptibility imaging method in accordance with one or more embodiments of the present disclosure.

| Reference numeral | Meaning |
|---|---|
| 101-103 | Step |
| 301 | Flow compensation module |
| 302 | Data acquisition module |
| 303 | Weighted imaging module |
| 41 | Water pump |
| 42 | Water pipe |
| 43 | Business model |
| 44 | Water pool |
| 45 | Coil |
| 46 | Door to scanner room |

DETAILED DESCRIPTION

To improve the scan efficiency, currently a 3D iEPI (interleaved Echo Planar Imaging) technique has been proposed as a fast alternative solution to 3D GRE. Because short EPI sequences are used, typical EPI related artifacts (distortion and fuzziness) are limited, images obtain gains in the signal-to-noise ratio and the efficiency, and compared with the traditional 3D GRE the similar contrast of amplitude images and phase images is also maintained. However, compared with GRE, EPI has a more complex design of flow compensations. Different from a GRE sequence from which one echo is collected in one excitation, an EPI sequence requires a plurality of echoes to be collected in one excitation. Thus, it is difficult to perform flow compensations in three directions at the time of flow compensations, unless the flyback method is used to compensate echoes having the same readout gradient polarity in the frequency encoding direction. However, this will sacrifice the scan efficiency.

Therefore, to make the best of the scan efficiency of GMN when GMN is applied to an EPI sequence, only the central echo in each excitation is compensated in all three dimensions, namely, the slice encoding, phase encoding, and frequency encoding directions, in the embodiments of the present disclosure if the implementation of flow compensation of the slice select gradient is the same as that of 3D GRE.

To make clearer the objects, technical solutions, and advantages of the present disclosure, the following gives embodiments to further describe the present disclosure in detail.

FIG. 1 shows an example fast susceptibility imaging method provided by one or more embodiments of the present disclosure. As shown in FIG. 1, the method may comprise the following steps:

Step 101: Perform flow compensations in the slice, phase, and frequency encoding directions for the central echo of a plurality of echoes excited each time in the iEPI.

Figure 2:
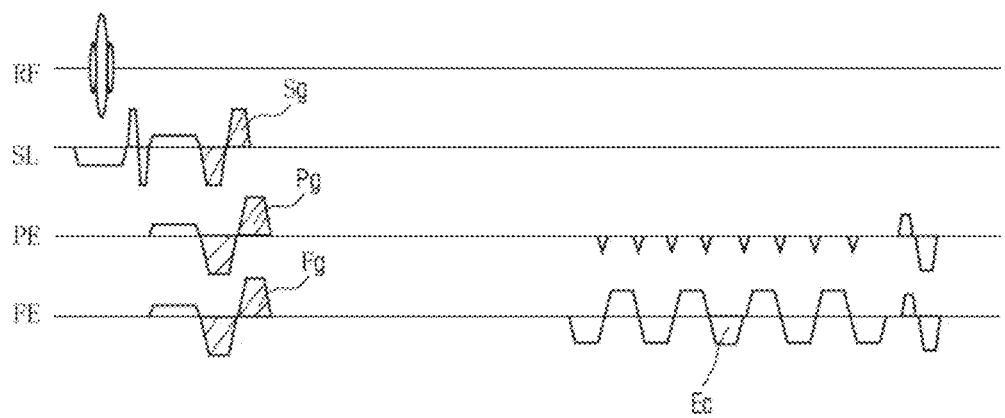
FIG. 2 shows example exertions of flow compensation gradients in a 3D iEPI sequence in accordance with one or more embodiments of the present disclosure.

In the present disclosure, the number of echoes may be an odd number. In this way, the central echo is the middle echo, for example, the third echo in five echoes. FIG. 2 shows the exertions of flow compensation gradients in a 3D iEPI sequence in accordance with one or more embodiments of the present disclosure. It can be seen that for each excitation, flow compensation gradients Sg, Pg, and Fg are exerted in the slice encoding PA, phase encoding PE, and frequency encoding FE directions, and the calculations of the flow compensation gradients Sg, Pg, and Fg are based on the central echo Ec of a plurality of echoes excited each time.

Since the flow compensation in the slice select direction does not involve a plurality of echoes, the flow compensation may be the same as that in 3D GRE and may directly be calculated according to the slice select gradient.

Flow compensations in the slice encoding, phase encoding, and frequency encoding directions may be calculated according to the following formulas (1) to (3), respectively:

$$M_{1,par} = M_{0,par} \Delta t_{par} \tag{1}$$

$$M_{1,phase} = M_{0,phaseprephase} \Delta t_p + \sum_{k=1}^{k_{center}} M_{0,pk} \Delta t_{pk} \tag{2}$$

$$M_{1,freq} = M_{0,freqprephase} \Delta t_f + M_{1,k_{center}} + \sum_{k=0}^{k_{center}} M_{0,fk} \Delta t_{fk} \tag{3}$$

wherein $M_{1,par}$, $M_{1,phase}$, and $M_{1,freq}$ are first-order moments at the central echo in the slice encoding direction, phase encoding direction, and frequency encoding direction, respectively, (in the present disclosure, corresponding flow compensation gradients may be so designed that the first-order moments at the central echo are finally zero), $M_{0,phaseprephase}$, $M_{0,freqprephase}$, and $M_{0,par}$ are the zero-order moments of the prephase gradients in the phase and frequency encoding directions and the slice encoding gradient, respectively, and are different in different excitations, $\Delta t_p$, $\Delta t_f$, and $\Delta t_{par}$ are the times from the prephase gradient centers in the phase and frequency encoding directions and the slice encoding gradient center to the echo center, respectively, $M_{0,pk}$ and $M_{0,fk}$ are zero-order moments of the phase and frequency encoding gradients of the $k^{th}$ echo in one excitation, respectively, $\Delta t_{pk}$ and $\Delta t_{fk}$ are the times from the encoding gradient of the $k^{th}$ echo in the phase and frequency encoding directions to the central echo, respectively, $\Delta t_p$, $\Delta t_{pk}$, $\Delta t_f$ and $\Delta t_{fk}$ are different in different excitations, and $M_{1,k_{center}}$ is the first-order moment of the frequency encoding gradient of the central echo in one excitation.

Step 102: Collect echo data for which flow compensations have been performed.

In this step, one scan may be performed to obtain echo data. Alternatively, to further reduce the phase oscillation between odd and even echoes after each excitation, two scans may be performed for each excitation and readout gradients with opposite polarities may be used for the two scans to collect data. For example, if nine echoes are excited each time and negative-positive-negative-positive-negative-positive-negative-positive-negative readout gradients are exerted for the first scan, then positive-negative-positive-negative-positive-negative-positive-negative-positive readout gradients can be exerted for the second scan. After that, the data collected during the two scans may be added to obtain corresponding echo data of the excitation.

Step 103: Perform SWI for collected echo data.

An embodiment of the method of the present disclosure has been described in detail above, and an embodiment of the device of the present disclosure will be described in detail below. The device in an embodiment of the present disclosure may be used to implement the method embodiment of the present disclosure. For the details not disclosed in the embodiment of the device of the present disclosure, refer to the corresponding description in the embodiment of the method of the present disclosure. These details will not be described again for purposes of brevity.

Figure 3:
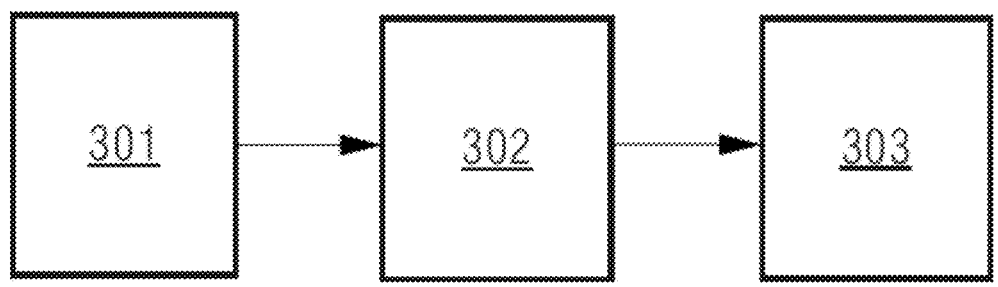
FIG. 3 shows an example fast susceptibility imaging device in accordance with one or more embodiments of the present disclosure.

FIG. 3 shows an example fast susceptibility imaging device in accordance with one or more embodiments of the present disclosure. As shown in FIG. 3, the device may comprise a flow compensation module 301, a data acquisition module 302, and a weighted imaging module 303. Each of the flow compensation module 301, data acquisition module 302, and weighted imaging module 303 may be implemented as any suitable type of hardware component, software component, or any suitable combination thereof to accomplish the various functions as discussed herein. Thus, the low compensation module 301, the data acquisition module 302, and the weighted imaging module 303 may be implemented as a computing device, one or more processors, processing circuitry, etc., which may operate as independent hardware components or execute machine-readable instructions to perform the functions as described in further detail herein. Thus, the low compensation module 301, data acquisition module 302, and weighted imaging module 303 may alternatively be referred to herein as low compensation circuitry 301, data acquisition circuitry 302, and weighted imaging circuitry 303.

The flow compensation module 301 is configured to perform flow compensation in the slice, phase, and frequency encoding directions for the central echo of a plurality of echoes excited each time in the iEPI.

In the present embodiment and example implementation, the flow compensation module performs flow compensations in the slice, phase, and frequency encoding directions according to formulas (1) to (3).

The data acquisition module 302 is configured to collect echo data for which flow compensations have been performed.

In the present embodiment and example implementation, the data acquisition module 302 performs two scans for each excitation, wherein readout gradients with opposite polarities are used for data collections during the two scans, and adds the data collected during the two scans to obtain corresponding echo data of the excitation.

The weighted imaging module 303 is configured to perform susceptibility-weighted imaging for collected echo data. The result of the susceptibility-weighted imaging may be to generate, output, or otherwise provide images of a target region in accordance with the two (or more) scans.

A magnetic resonance imaging system provided by the embodiments of the present disclosure may comprise the above-mentioned fast susceptibility imaging device.

Figure 4:
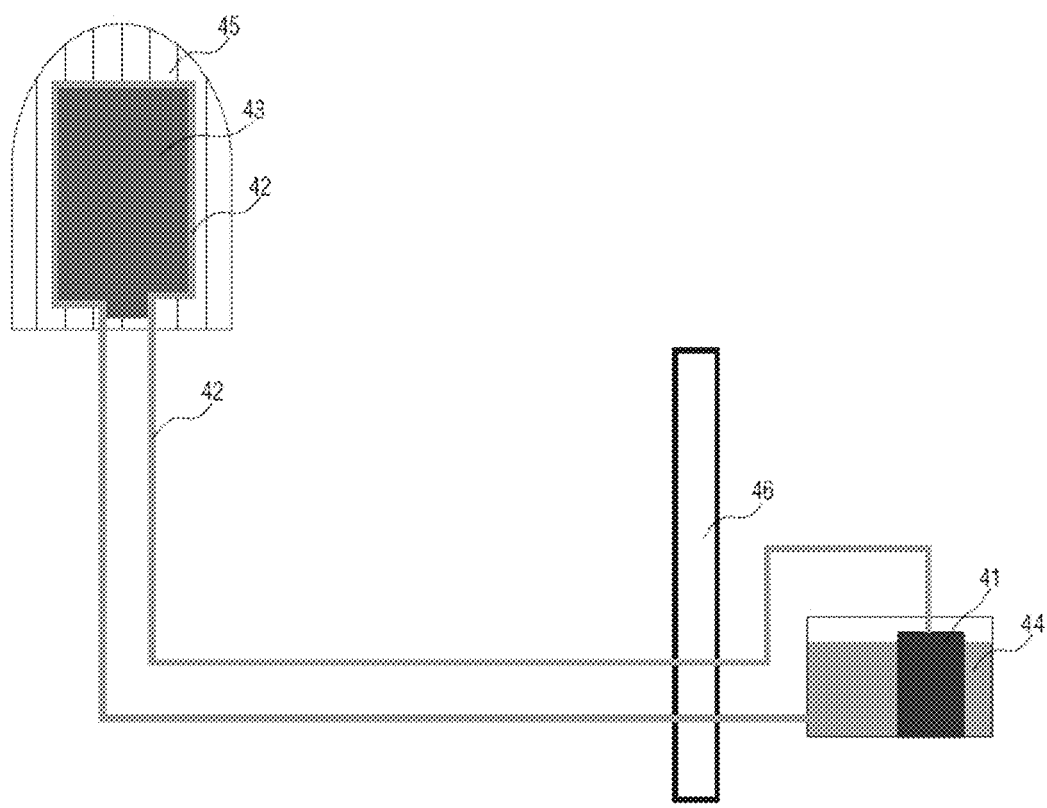
FIG. 4 shows an example flow model in accordance with one or more embodiments of the present disclosure.

To evaluate the flow compensation effect in the embodiments of the present disclosure, any suitable commercial scanner (e.g. a commercial 1.5 T scanner) may be equipped with any suitable number of channels (e.g. a 20-channel head/neck coil) to perform scans for the 3D iEPI and the conventional 3D GRE in one example. First, as shown in FIG. 4, the object to be scanned is a flow model consisting of a water pipe 42 driven by a water pump 41 and filled with flowing water and a standard water model 43 as a reference. The water pump 41 is used to pump water from a water pool 44 into the water pipe 42, and a coil 45 is arranged in the area of the standard water model 43 surrounded by the water pipe 42. In addition, to prevent the water pump 41 from interfering with a scan, the water pump 41 is placed in an operation room away from the scanner room. The door 46 to the scanner room is schematically shown. To compare the scenarios where water flows and does not flow, 3D iEPI may be used to collect data when the water pump 41 is started and stopped, respectively, namely, 3D iEPI may be used to collect data when water in the water pipe 42 is controlled to be in a flowing or static state.

Figures 5A, 5B, 5C:
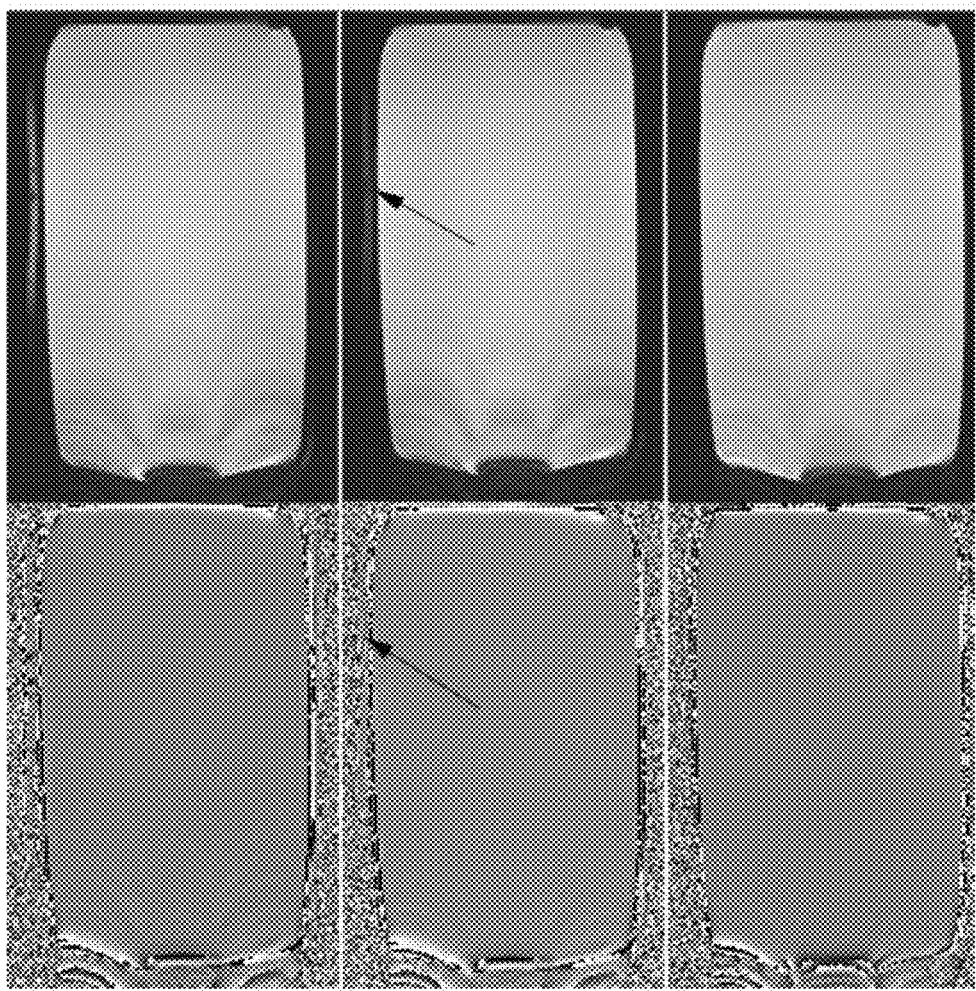
FIGS. 5A to 5C show example images of the flow model acquired by using 3D iEPI in accordance with one or more embodiments of the present disclosure.

FIGS. 5A to 5C show the images of the flow model acquired by using 3D iEPI in the phase encoding direction in one example. The vertical direction is the phase encoding direction, and each column of images comprises an amplitude image and a phase image, respectively. FIG. 5A shows the images when water does not flow, FIG. 5B shows the images when water flows and a flow compensation is performed, and FIG. 5C shows the images when water flows but no flow compensation is performed. The arrows in FIG. 5B indicate the flowing water in the water pipe when a flow compensation is adopted, and it can be seen that the images of flowing water in the water pipe are the same as those of non-flowing water in the water pipe in FIG. 5A.

Figures 6A, 6B, 6C:
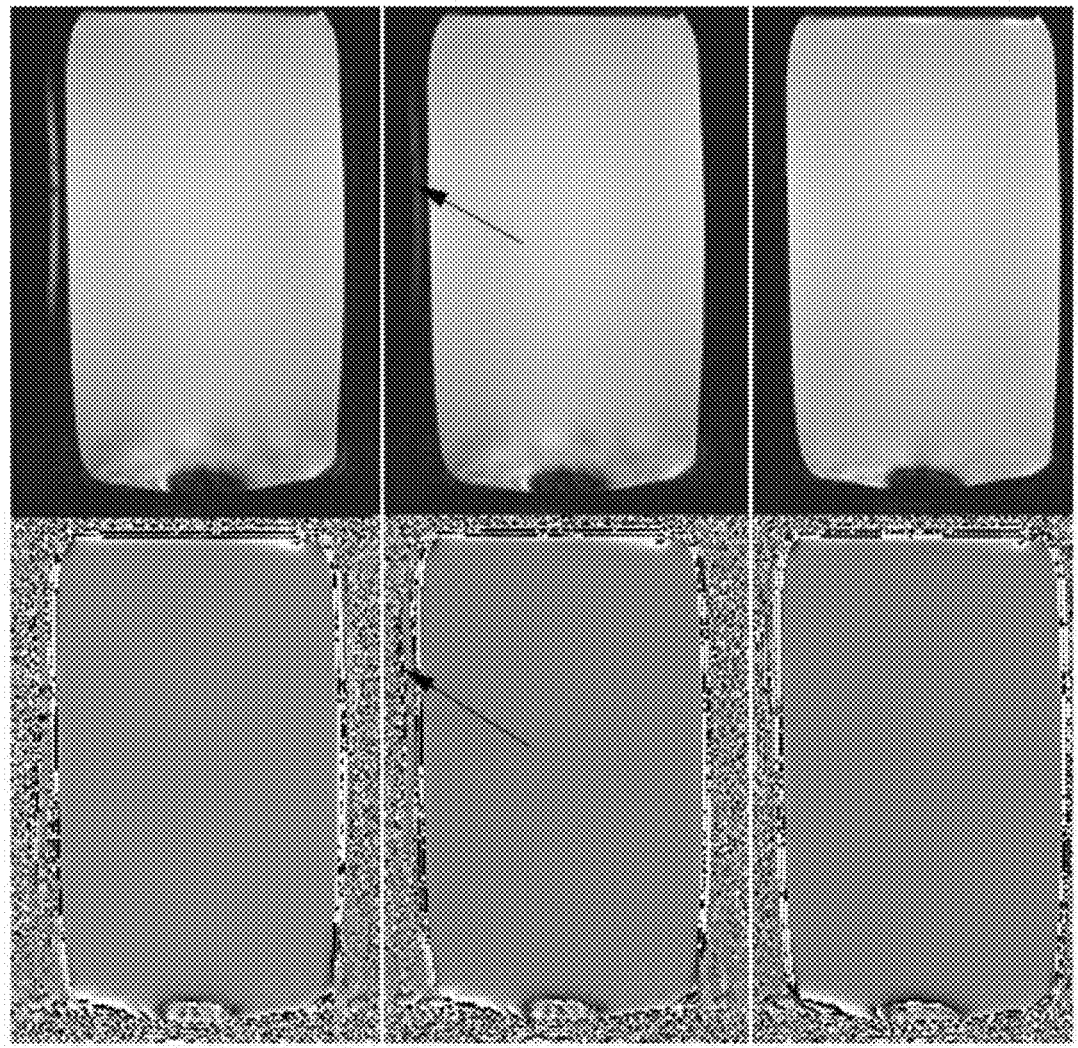
FIGS. 6A to 6C show example images of the flow model acquired by using 3D iEPI in accordance with one or more embodiments of the present disclosure.

FIGS. 6A to 6C show the images of the flow model acquired by using 3D iEPI in the phase encoding direction in another example. The vertical direction is the frequency encoding direction. Different from FIG. 5, the flowing direction of water in the water pipe is the same as the frequency encoding direction in FIG. 6, and two scans with opposite readout gradient polarities are performed for each excitation. The arrows in FIG. 6B indicate the flowing water in the water pipe when a flow compensation is adopted, and it can be seen that the flow compensated images in FIG. 6B are the same as those of non-flowing water in the water pipe in FIG. 6A.

Figure 7:
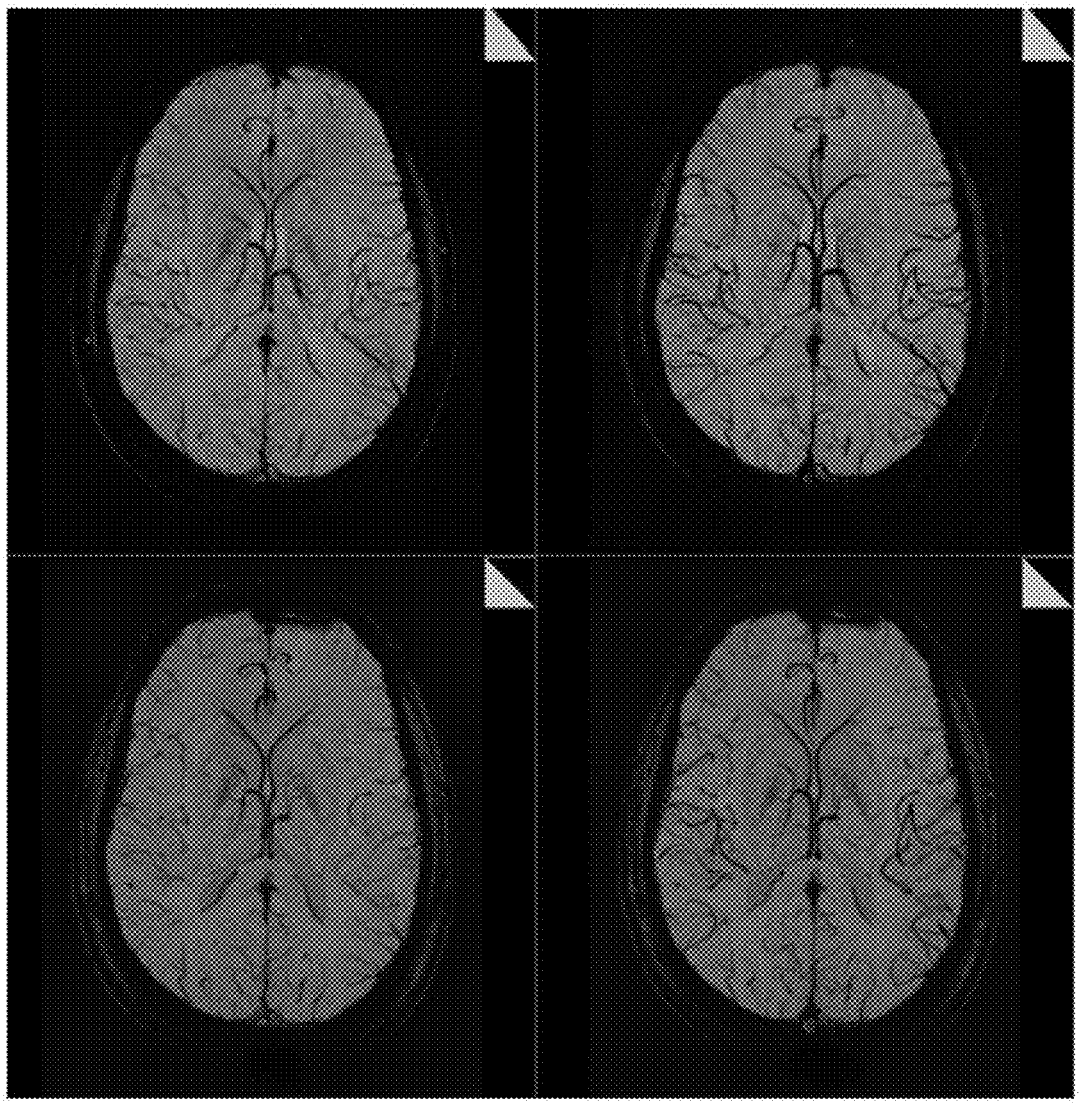
FIG. 7 shows an example comparison of minimum intensity projection (mIP) images for which flow compensations are performed/not performed for 3D GRE SWI processing and 3D iEPI SWI processing in the resolution of $0.7\times0.7\times1.6$ mm$^3$.

FIG. 7 shows a comparison of mIP images for which flow compensations are performed/not performed for 3D GRE SWI processing and 3D iEPI SWI processing in the resolution of 0.7×0.7×1.6 mm³. In FIG. 7, from left to right, the two upper images are images corresponding to 3D flow compensated iEPI and 3D non-flow compensated iEPI, respectively, and the acquisition time is 2 minutes and 57 seconds. From left to right, the two lower images are images corresponding to 3D flow compensated GRE and 3D non-flow compensated GRE, respectively, and the acquisition time is 5 minutes and 49 seconds. 13 echoes are collected after each RF pulse. The mIPs of two sequences display the same blood vessel. It can be seen that after a flow compensation is applied in two sequences, the flow effect may be relieved, and may be more relieved in 3D GRE because flow compensations are performed in the three directions for all echoes.

Figures 8A, 8B, 8C:
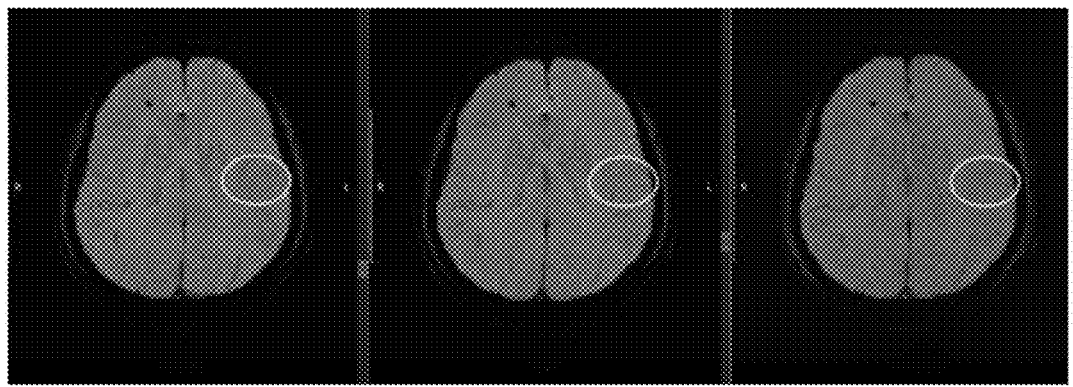
FIGS. 8A to 8C show an example comparison of mIP images for which flow compensations are performed/not performed for 3D GRE SWI processing and 3D iEPI SWI processing in the resolution of $0.9\times0.9\times2$ mm$^3$.

FIGS. 8A to 8C show a comparison of mIP images for which flow compensations are performed/not performed for 3D GRE SWI processing and 3D iEPI SWI processing in the resolution of 0.9×0.9×2 mm³. FIG. 8A is an image corresponding to 3D flow compensated iEPI in combination with two scans with opposite readout gradient polarities, the average number of collected echoes is 4, and the acquisition time is 3 minutes and 54 seconds; FIG. 8B is an image corresponding to 3D flow compensated iEPI, the average number of collected echoes is 4, and the acquisition time is 3 minutes and 54 seconds; FIG. 8C is an image corresponding to 3D fully flow compensated GRE, the acquisition time is 3 minutes and 56 seconds, and the average number of collected echoes is 1. 15 echoes are collected after each RF pulse in a 3D iEPI sequence. Since the average number of collected echoes is 4, the signal-to-noise ratios in FIGS. 8A and 8B are much higher than in FIG. 8C, and similar blood vessels can be seen. In addition, compared with FIG. 8B, since two scans with opposite readout gradient polarities are used and undesired signals produced during a phase oscillation are reduced, FIG. 8A can obtain the result more similar to that in FIG. 8C, as indicated by the circles.

Thus, it can be seen that the 3D iEPI sequence in the embodiments of the present disclosure have the following advantages:
1. Compared with the prior SWI sequence, the acquisition time is greatly shortened since a high-efficiency acquisition solution is adopted.
2. A high scan efficiency and a small distortion can be maintained in 3D iEPI since the echo interval is short compared with the 3D fully flow compensated iEPI sequence in the flyback method.
3. Compared with the 3D non-flow compensated iEPI sequence, undesired signals caused by mixed phase information from fast arterial flows in SWI images can be reduced.
4. For one acquisition, readout gradients with opposite polarities are used to perform two scans, and the phase oscillation between odd and even echoes after each excitation can be further reduced.

The above-mentioned embodiments are provided by way of example and not limitation, and are not provided to restrict the present disclosure. Without departing from the spirit and principle of the present disclosure, modifications, equivalent replacements, and improvements all fall within the scope of protection of the present disclosure.

What is claimed is:
1. A fast susceptibility imaging method, comprising:
performing, for a central echo of a plurality of echoes excited in an interleaved Echo Planar Imaging (iEPI) scan, flow compensations in each one of a slice, phase, and frequency encoding direction;
collecting echo data from the plurality of echoes excited in the interleaved Echo Planar Imaging scan for which flow compensations have been performed by (i) performing two scans for a corresponding excitation using respective readout gradients having opposite polarities as one another to collect data for each one of the two scans, and (ii) adding the data collected during each one of the two scans to obtain corresponding echo data of the excitation; and
performing, using the collected echo data, susceptibility-weighted imaging to provide one or more images of a target region associated with the iEPI scan.
2. The fast susceptibility imaging method as claimed in claim 1, wherein the act of performing the flow compensa- tions in each one of the slice, phase, and frequency encoding direction for the central echo comprises:
performing flow compensations in each one of the slice, phase, and frequency encoding directions according to the following formulas:

$$M_{1,par} = M_{0,par}\Delta t_{par};$$

$$M_{1,phase} = M_{0,phaseprephase}\Delta t_p + \sum_{k=1}^{k_{center}} M_{0,pk}\Delta t_{pk}; \text{ and}$$

$$M_{1,freq} = M_{0,freqprephase}\Delta t_f + M_{1,k_{center}} + \sum_{k=0}^{k_{center}} M_{0,fk}\Delta t_{fk},$$

wherein:
$M_{1,par}$, $M_{1,phase}$ and $M_{1,freq}$ represent first-order moments at the central echo in the slice encoding direction, phase encoding direction, and the frequency encoding direction, respectively,
$M_{0,phaseprephase}$, $M_{0,freqprephase}$, and $M_{0,par}$ represent zero-order moments of the prephase gradients in the phase encoding direction, the frequency encoding direction, and the slice encoding gradient, respectively, and are different in different excitations,
$\Delta t_p$, $\Delta t_f$ and $\Delta t_{par}$ represent times from the prephase gradient centers in the phase encoding direction, the frequency encoding direction, and the slice encoding gradient center to the echo center, respectively,
$M_{0,pk}$ and $M_{0,fk}$ represent zero-order moments of the phase encoding gradients and frequency encoding gradients of the $k^{th}$ echo in one excitation, respectively,
$\Delta t_{pk}$ and $\Delta t_{fk}$ represent times from the encoding gradient of the $k^{th}$ echo in the phase encoding direction and the frequency encoding direction to the central echo, respectively,
$\Delta t_p$, $\Delta t_{pk}$, $\Delta t_f$, and $\Delta t_{fk}$ are different in different excitations, and
$M_{1,k_{center}}$ represents a first-order moment of a frequency encoding gradient of the central echo in one excitation.

3. The method of claim 1, wherein the act of performing the flow compensation in each one of the slice, phase, and frequency encoding direction comprises:
calculating flow compensation gradients for each one of the slice, phase, and frequency encoding direction based on the central echo of the plurality of echoes.

4. The method of claim 1, wherein:
the respective readout gradients having opposite polarities as one another comprise a first set of readout gradients and a second set of readout gradients,
an initial gradient field of the first set of readout gradients has a first polarity, and
an initial gradient field of the second set of readout gradients has a second polarity that is opposite to the first polarity.

5. The method of claim 4, wherein each gradient field from among the first set of readout gradients has an opposite polarity as each gradient field from among the second set of readout gradients having a matching readout gradient position.

6. A fast susceptibility imaging device, comprising:
flow compensation circuitry configured to perform, for a central echo of a plurality of echoes excited in an interleaved Echo Planar Imaging (iEPI) scan, flow compensations in each one of the slice, phase, and frequency encoding direction;
data acquisition circuitry configured to collect echo data from the plurality of echoes excited in the interleaved Echo Planar Imaging scan for which flow compensations have been performed by (i) performing two scans for a corresponding excitation using respective readout gradients having opposite polarities as one another to collect data for each one of the two scans, and (ii) adding the data collected during each one of the two scans to obtain corresponding echo data of the excitation; and
weighted imaging circuitry configured to perform, using the collected echo data, susceptibility-weighted imaging to provide one or more images of a target region associated with the iEPI scan.

7. The fast susceptibility imaging device as claimed in claim 6, wherein the flow compensation circuitry is configured to perform the flow compensations in each one of the slice, phase, and frequency encoding directions according to the following formulas:

$$M_{1,par} = M_{0,par}\Delta t_{par};$$

$$M_{1,phase} = M_{0,phaseprephase}\Delta t_p + \sum_{k=1}^{k_{center}} M_{0,pk}\Delta t_{pk}; \text{ and}$$

$$M_{1,freq} = M_{0,freqprephase}\Delta t_f + M_{1,k_{center}} + \sum_{k=0}^{k_{center}-1} M_{0,fk}\Delta t_{fk},$$

wherein:
$M_{1,par}$, $M_{1,phase}$ and $M_{1,freq}$ represent first-order moments at the central echo in the slice encoding direction, phase encoding direction, and the frequency encoding direction, respectively,
$M_{0,phaseprephase}$, $M_{0,freqprephase}$, and $M_{0,par}$ represent zero-order moments of the prephase gradients in the phase encoding direction, the frequency encoding direction, and the slice encoding gradient, respectively, and are different in different excitations,
$\Delta t_p$, $\Delta t_f$ and $\Delta t_{par}$ represent times from the prephase gradient centers in the phase encoding direction, the frequency encoding direction, and the slice encoding gradient center to the echo center, respectively,
$M_{0,pk}$ and $M_{0,fk}$ represent zero-order moments of the phase encoding gradients and frequency encoding gradients of the $k^{th}$ echo in one excitation, respectively,
$\Delta t_{pk}$ and $\Delta t_{fk}$ represent times from the encoding gradient of the $k^{th}$ echo in the phase encoding direction and the frequency encoding direction to the central echo, respectively,
$\Delta t_p$, $\Delta t_{pk}$, $\Delta t_f$, and $\Delta t_{fk}$ are different in different excitations, and
$M_{1,k_{center}}$ represents a first-order moment of a frequency encoding gradient of the central echo in one excitation.

8. The fast susceptibility imaging device as claimed in claim 6, wherein the flow compensation circuitry is configured to perform the flow compensation in each one of the slice, phase, and frequency encoding direction by calculating flow compensation gradients for each one of the slice, phase, and frequency encoding direction based on the central echo of the plurality of echoes.

9. The fast susceptibility imaging device as claimed in claim 6, wherein:
- the respective readout gradients having opposite polarities as one another comprise a first set of readout gradients and a second set of readout gradients,
- an initial gradient field of the first set of readout gradients has a first polarity, and
- an initial gradient field of the second set of readout gradients has a second polarity that is opposite to the first polarity.

10. The fast susceptibility imaging device as claimed in claim 9, wherein each gradient field from among the first set of readout gradients has an opposite polarity as each gradient field from among the second set of readout gradients having a matching readout gradient position.

* * * * *